(12) United States Patent
Takagi et al.

(10) Patent No.: US 12,713,954 B2
(45) Date of Patent: Aug. 18, 2026

(54) ELECTRONIC APPARATUS

(71) Applicant: DENSO CORPORATION, Kariya-city (JP)

(72) Inventors: Kenichiro Takagi, Nisshin-city (JP); Akira Tokumasu, Kariya-city (JP)

(73) Assignee: DENSO CORPORATION, Kariya (JP)

( * ) Notice: Subject to any disclaimer, the term of this patent is extended or adjusted under 35 U.S.C. 154(b) by 443 days.

(21) Appl. No.: 18/528,856

(22) Filed: Dec. 5, 2023

(65) Prior Publication Data

US 2024/0120264 A1 Apr. 11, 2024

Related U.S. Application Data

(63) Continuation of application No. PCT/JP22/21598, filed on May 26, 2022.

(30) Foreign Application Priority Data

Jun. 9, 2021 (JP) ................................ 2021-096729

(51) Int. Cl.
*H01L 23/498* (2006.01)
*H10W 70/685* (2026.01)
*H10W 70/69* (2026.01)
*H10W 74/10* (2026.01)

(52) U.S. Cl.
CPC ......... *H10W 70/685* (2026.01); *H10W 70/69* (2026.01); *H10W 74/137* (2026.01)

(58) Field of Classification Search
CPC .. H10W 70/685; H10W 70/69; H10W 74/137
See application file for complete search history.

(56) References Cited

U.S. PATENT DOCUMENTS

2018/0092201 A1 3/2018 Otsubo et al.

FOREIGN PATENT DOCUMENTS

JP S52-005254 U 1/1977
JP 2020-077744 A 5/2020

OTHER PUBLICATIONS

Aug. 16, 2022 International Search Report issued in International Patent Application No. PCT/JP2022/021598.

*Primary Examiner* — Victor A Mandala
*Assistant Examiner* — Colleen E Snow
(74) *Attorney, Agent, or Firm* — Oliff PLC

(57) ABSTRACT

The first conductive part includes a first surface layer part and a first inner layer part constituting a layer different from the first surface layer part in the substrate. The second conductive part includes a second surface layer part facing the first surface layer part with a creeping distance therebetween, and a second inner layer part constituting a layer different from the second surface layer part in the substrate. The electronic apparatus is provided with at least one of a first protruded configuration and a second protruded configuration. The first protruded configuration is configured such that the first inner layer part includes a first conductive protrusion protruding towards the second conductive part from the first surface layer part. The second protruded configuration is configured such that the second inner layer part includes a second conductive protrusion protruding towards the first conductive part from the second surface layer part.

9 Claims, 12 Drawing Sheets

CONTROL CIRCUIT
30
30p
30n
30u
30v
30w
Vp
Vn
Vu
Vv
Vw
Vg
10
11
19
20
31
32
33
34
35
36
41
42
43
44
45
46
48
48i
40
50
51
52
53
C 40
48
49
41
42
43
44
45
46
G
Vu
Vv
Vw
Vn
Vg
III

<COMPARATIVE EXAMPLE>

<PRESENT EMBODIMENT>

<MODIFICATION EXAMPLE 1>

<MODIFICATION EXAMPLE 2>

⟨MODIFICATION EXAMPLE 4⟩
40
48
49
41
42
43
44
45
46
Vu
Vv
Vw
Vn
Vn
Vn
Vg
G
p
X
Y
Z

<MODIFICATION EXAMPLE 5>
40
48
49
41
42
43
44
45
46
Vu
Vv
Vw
Vn
Vn
Vn
Vg
G
p
X
Y
Z

<MODIFICATION EXAMPLE 7>

<MODIFICATION EXAMPLE 8>

<MODIFICATION EXAMPLE 9>

ELECTRONIC APPARATUS

CROSS-REFERENCE TO RELATED APPLICATIONS

This application is the U.S. bypass application of International Application No. PCT/JP2022/021598 filed on May 26, 2022, which designated the U.S. and claims priority to Japanese Patent Application No. 2021-096729 filed on Jun. 9, 2021, the contents of which is incorporated herein by reference.

BACKGROUND

Technical Field

The present disclosure relates to an electronic apparatus having a substrate of an insulator and a circuit mounted thereon.

Description of the Related Art

In such electronic apparatuses, one apparatus has a circuit including a predetermined first conduction part, and a second conduction part positioned adjacently to the first conduction part having a potential different from that of the first conduction part. In this case, a creeping distance is required to be secured between the first conduction part and the second conduction part in order to avoid discharge therebetween. However, considering shrinkage of the substrate, such a creeping distance may be required to be as short as possible.

SUMMARY

An electronic apparatus according to the present disclosure is provided with a substrate made of an insulator and a circuit mounted on the substrate. The circuit includes a first conductive part having a plurality of layers in a predetermined lamination direction and a second conductive part having a plurality of layers in a portion positioned away from the first conductive part in a direction orthogonal to the lamination direction, a potential of the second conductive part being different from that of the first conductive part.

BRIEF DESCRIPTION OF THE DRAWINGS

The above-described objects and other objects, features and advantages of the present disclosure will be clarified further by the following detailed description with reference to the accompanying drawings. The drawings are.

DETAILED DESCRIPTION OF THE PREFERRED EMBODIMENTS

An electronic apparatus having a substrate of an insulator and a circuit mounted thereon is known. In such electronic apparatuses, one apparatus has a circuit including a predetermined first conduction part, and a second conduction part positioned adjacently to the first conduction part having a potential different from that of the first conduction part. In this case, a creeping distance is required to be secured between the first conduction part and the second conduction part in order to avoid discharge therebetween. However, considering shrinkage of the substrate, such a creeping distance may be required to be as short as possible.

In this regard, some electronic apparatus is configured in order to suppress a discharge regardless of the creeping distance such that at least one of the first conduction part and the second conduction part is sealed with a resin having insulation properties. The following patent literature 1 discloses such a technique.

According to the above-described technique, a discharge region is occupied by a resin sealing, whereby a discharge can be suppressed regardless of the creeping distance. Therefore, an area of the substrate can be smaller.

However, in the case where the conductor is sealed by such a resin sealing, since the resin sealing is required, material cost increases. Further, a concave portion is required for storing the resin sealing in a fluidized state. Hence, when the concave portion is provided, the manufacturing cost increases. Further, a process for pouring the resin sealing into the concave portion and then solidifying the resin sealing in the concave portion is required. Hence, the manufacturing cost increases with this process also. Moreover, since the conductor is sealed with a resin different from the substrate material, there is a concern that resin-peeling or deterioration of insulation properties possibly occur due to an aging degradation.

Hereinafter, with reference to the drawings, embodiments of the present disclosure will be described. The present disclosure is not limited to the following embodiments, but may be appropriately modified without departing from spirit of the present disclosure.

First Embodiment

Figure 1:
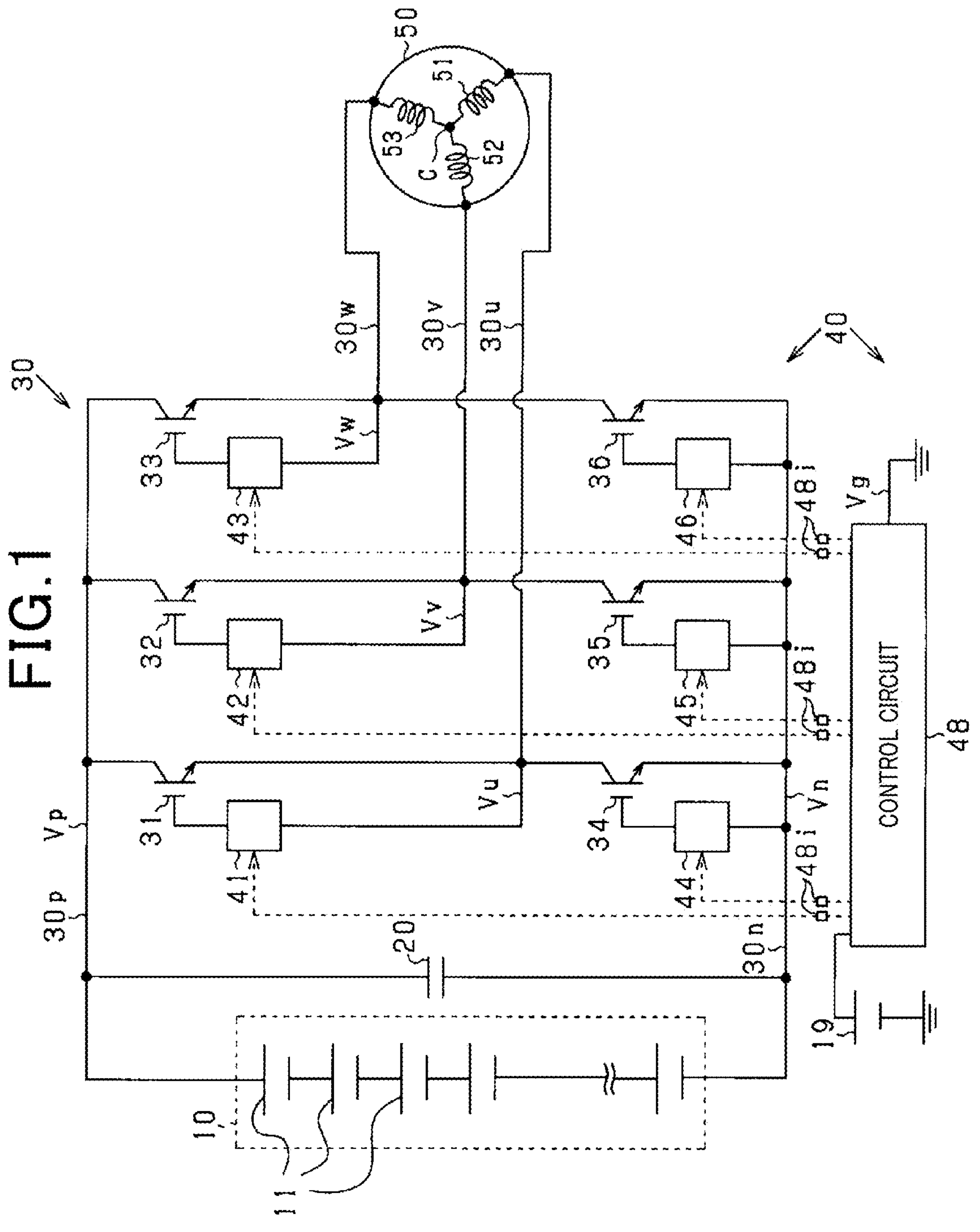
FIG. 1 is a circuit diagram showing electronic equipment and its periphery according to the first embodiment.

FIG. 1 is a circuit diagram showing a switch driving unit 40 as electronic equipment and its periphery according to the present embodiment. In the vehicle, a main battery 10, an inverter 30, a switch driving unit 40 and a three-phase coil 50. Hereinafter, 'being electrically connected' is simply referred to as 'connection'.

The main battery 10 includes a series-connection of a plurality of battery cells 11. Each battery cell 11 is a lithium-ion battery and the like. A positive electrode wiring 30*p* is connected to the positive electrode of the main battery 10, and a negative electrode wiring 30*n* is connected to the negative electrode of the main battery 10. The positive wiring 30*p* and the negative electrode wiring 30*n* are connected via a smoothing capacitor 20. In the following description, a potential of the positive electrode wiring 30*p* is referred to as positive potential Vp and a potential of the negative electrode wiring 30*n* is referred to as negative potential Vn.

The inverter 30 includes total six switches 31 to 36 composed of three upper switches 31 to 33 and three lower switches 34 to 36. The three upper switches 31 to 33 are composed of U-phase upper switch 31, V-phase upper switch 32 and a W-phase upper switch 33. On the other hand, three lower switches 34 to 36 are composed of U-phase lower switch 34, a V-phase lower switch 35 and a W-phase lower switch 36.

These six switches 31 to 36 are each configured of a semiconductor switch such as IGBT, MOSFET and bipolar transistor (IGBT in the drawings), having a positive electrode terminal (collector terminal in the drawings) and a negative electrode terminal (emitter terminal in the drawings) and a control terminal (gate terminal in the drawings).

The positive electrode wiring 30*p* is connected to the positive electrode terminal of each of the three upper switches 31 to 33. The negative electrode wiring 30*n* is connected to the negative electrode terminal of each of the three lower switches 34 to 36.

The three-phase coil 50 includes 3 coils 51 to 53, that is, a U phase coil 51, a V phase coil 52 and W phase coil 53. These 3 coils 51 to 53 are star-connected according to the present embodiment. In other words, one end of the U phase coil 51, one end of the V phase coil 52 and one end of the W phase coil 53 are mutually connected at a neutral point C. However, alternatively, a delta connection may be applied thereto, for example.

One end of the U phase coil 51 opposite to the neutral point C is connected to the negative electrode terminal of the U phase upper switch 31 and the positive electrode terminal of the U phase lower switch 34 via a U phase wiring 30*u*. One end of the V phase coil 52 opposite to the neutral point C is connected to the negative electrode terminal of the V phase upper switch 32 and the positive electrode terminal of the V phase lower switch 35 via the V phase coil 52. One end of the W phase coil 53 opposite to the neutral point C is connected to the negative electrode terminal of W phase upper switch 33 and the positive electrode terminal of the W phase lower switch 36 via a W phase wiring 30W.

Hereinafter, a potential of the U phase wiring 30*u* is referred to as U phase potential Vu, a potential of the V phase wiring 30*v* is referred to as V phase potential Vv and a potential of the W phase wiring 30*w* is referred to as W phase potential Vw.

The switch driving unit 40 includes six drive circuits 41 to 46, that is, three upper drive circuits 41 to 43 and three lower drive circuits 44 to 46. The three upper drive circuits 41 to 43 are composed of the U phase upper drive circuit 41, the V phase upper drive circuit 42 and the W phase upper drive circuit 43. On the other hand, the three lower drive circuits 44 to 46 are composed of the U phase lower drive circuit 44, the V phase lower drive circuit 45 and the W phase lower drive circuit 46.

The respective six drive circuits 41 to 46 each includes a reference potential terminal as a negative electrode side terminal and an output terminal as a positive electrode side terminal. For the U phase upper drive circuit 41, the reference potential terminal is connected to the U phase wiring 30*u* and the output terminal is connected to the control terminal of the U phase upper switch 31. For the V phase upper drive circuit 42, the reference potential terminal is connected to the V phase wiring 30*v* and the output terminal is connected to the control terminal of the V phase upper switch 32. For the W phase upper drive circuit 43, the reference potential terminal is connected to the W phase wiring 30*w* and the output terminal is connected to the control terminal of the W phase upper switch 33. Thus, the reference potential of the U phase upper drive circuit is the U phase potential Vu, the reference potential of the V phase upper drive circuit 42 is the V phase potential Vv and the reference potential of the W phase drive circuit 43 is the W phase potential Vw.

For the U phase lower drive circuit 44, the reference potential terminal is connected to the negative electrode wiring 30*n* and the output terminal is connected to the U phase lower switch 34. For the V phase lower drive circuit 45, the reference potential terminal is connected to the negative electrode terminal 30*n* and the output terminal is connected to the control terminal of the V phase lower switch 36. As described, the reference potentials of the respective three drive circuits 44 to 46 are the negative potential Vn.

The switch driving unit 40 includes a control circuit 48 that controls these six drive circuits 41 to 46. The control circuit 48 is supplied with power from auxiliary battery 19. The control circuit 48 performs a duty control for each of the six switches 31 to 36 via the six drive circuits 41 to 46, thereby causing the three phase AC current to flow through the three phase coil 50. Since such a duty control is well-known technique, detailed explanation thereof will be omitted.

In the duty control, the U phase lower switch 34 is turned OFF at a timing where the U phase upper switch 31 is turned ON, and the U phase lower switch 34 is turned ON at a timing where the U phase upper switch 31 is turned OFF. Hereinafter, a state where the U phase upper switch 31 is ON and the U phase lower switch 34 is OFF is referred to as U phase ON state, and a state where the U phase switch 31 is OFF and the U phase lower switch 34 is ON is referred to as U phase OFF state.

Similarly, a state where the V phase upper switch 32 is ON and the V phase lower switch 35 is OFF is referred to as V phase ON state, and a state where the V phase upper switch 32 is OFF and the V phase lower switch 35 is ON is referred to as V phase OFF state. Moreover, a state where the W phase upper switch 33 is ON and the W phase lower switch 36 is OFF is referred to as W phase ON state, and a state where the W phase upper switch 33 is OFF and the W phase lower switch 36 is ON is referred to as W phase OFF state.

According to the above-described circuit configuration, the U phase potential Vu is the positive electrode potential Vp during the U phase ON state and the U phase potential Vu is the negative electrode potential Vn during the U phase OFF state. Similarly, the V phase potential Vv is the positive electrode potential Vp during the V phase ON state, and the V phase potential Vv is the negative electrode potential Vn during the V phase OFF state. Similarly, the W phase potential Vw is the positive electrode potential Vp during the W phase ON state, and the W phase potential Vw is the negative electrode potential Vn during the W phase ON state.

Then, the timing changing from the U phase ON state to the U phase OFF state, the timing changing from the V phase ON state to the V phase OFF state, and the timing changing from the W phase ON state to the W phase OFF state are mutually different. Hence, each of the reference potentials (Vu, Vv, Vw) of the respective three drive circuits 41 to 43 is different from the reference potentials of the respective two other drive circuit in a part of the period.

On the other hand, the reference potential terminal which is the negative electrode side terminal of the control circuit 48 is connected to a vehicle body. Hereinafter, the potential of the body is referred to as ground potential Vg. Hence, the reference potential of the control circuit 48 is the ground potential Vg. The positive electrode Vp is higher than the ground potential Vg and the negative electrode potential Vn is lower than the ground potential Vg. Accordingly, the reference potential (Vg) of the control circuit 48 is different from either of the reference potentials (Vu, Vv, Vw, Vn) of the six drive circuits 41 to 46. Hence, the control circuit 48 is connected to the respective six drive circuits 41 to 46 via an insulation element 48*i* such as a coupler or a transformer.

Figure 2:
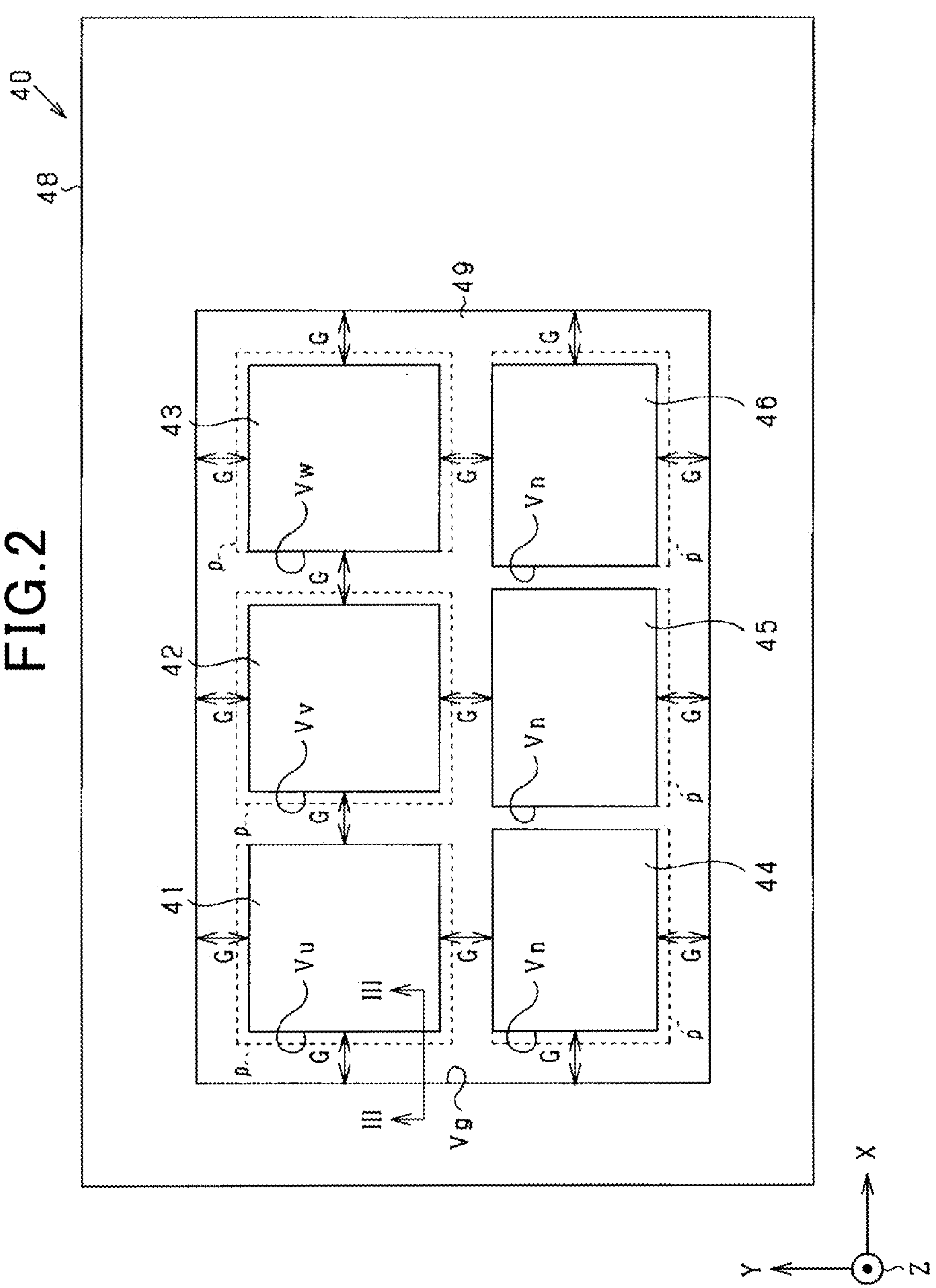
FIG. 2 is a plan view showing the electronic equipment.

FIG. 2 is a plan view showing the switch driving unit 40. The respective six drive circuits 41 and 46 and the control circuit 48 are mounted on a substrate 49 made of insulator such as a glass epoxy resin. Hereinafter, conforming to the drawings, a thickness direction of the substrate 49 is referred to as up-down Z, a predetermined direction orthogonal to the up-down Z is referred to as left-right X, and a direction orthogonal to both the up-down Z and the left-right X is referred to as front-rear Y. However, according to the present embodiment, the up-down Z, the left-right X and the front-rear Y may be set as any three directions which intersect perpendicularly with each other.

FIG. 2 is a plan view of the switch driving unit 40 viewed from the top to the bottom. Hereinafter, the plan view thus viewed from the top to the bottom is simply referred to as plan view. The three upper drive circuits 41 to 43 are arranged in the left-right X. Specifically, the V phase upper drive circuit 42 is disposed in the right side of the U phase upper drive circuit 41 and a W phase drive circuit is disposed in the right side of the V phase drive circuit 42. Then, the U phase lower drive circuit 44 is disposed in the front side of the U phase upper drive circuit 41, and the V phase lower drive circuit 45 is disposed in the front side of the V phase upper drive circuit 42. The control circuit 48 is provided surrounding the six drive circuits 41 to 46 from the front-rear Y and the left-right X.

The outer peripheral parts of the respective six circuits 41 to 46 in the plan view are at reference potentials thereof (Vu, Vv, Vw, Vn). The inner peripheral part of the control circuit 48 in the plan view, that is, portions facing the respective six drive circuits 41 to 46, are at the reference potential (Vg) of the control circuit 48.

Thus, the creeping distance G is secured for a portion between the control circuit 48 (Vg) and the respective six drive circuits 41 to 46 (Vu, Vv, Vw, Wn), a portion between the three upper drive circuits 41 to 43 (Vu, Vv, Vw) and the three lower drive circuits 44 to 46 (Vn) and a portion between three upper drive circuits 41 to 43 (Vu, Vv, Vw). The creeping distance G is approximately 4 mm.

Note that the creeping distance G is not secured between the three lower drive circuits 44 to 46 (Vn). This is because, reference potentials Vn of the respective three lower drive circuits 44 to 46 are the same, which is the negative potential Vn.

Hereinafter, a section where circuits face with each other, having a creeping distance G therebetween in the plan view are referred to as a facing section. More specifically, the facing section refers to a section having a length of a direction orthogonal to the creeping distance G.

Figure 3:
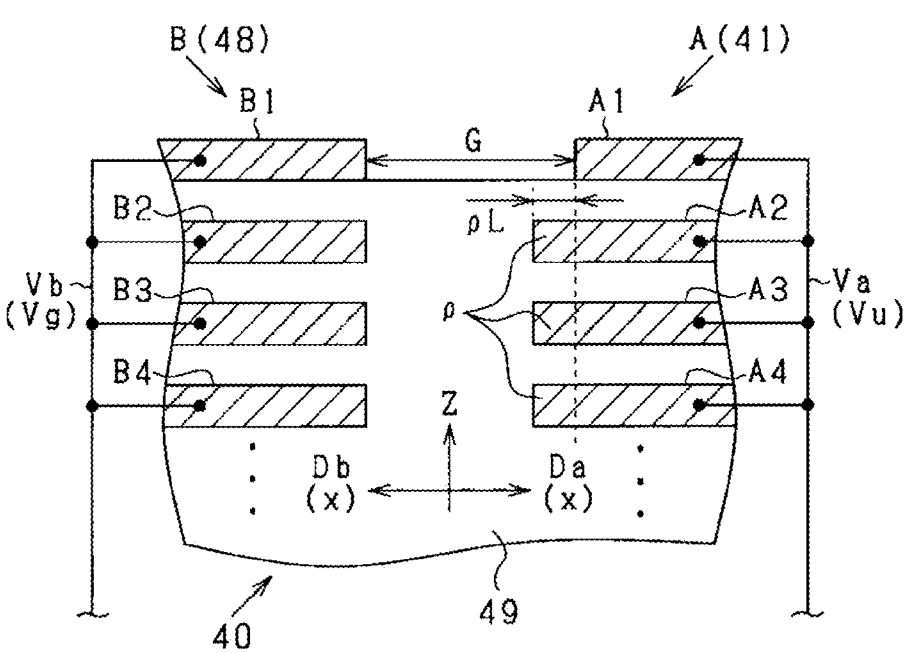
FIG. 3 is a front cross-sectional diagram showing a cross-section sectioned along III-III line shown in FIG. 2.

FIG. 3 is cross-sectional view showing a cross section sectioned at a line III-III in FIG. 2. Hereinafter, one of two conductors mutually facing with the creeping distance G therebetween and having different potentials, is referred to as a first conductor part A and the other conductor is referred to as second conductor part B. Hence, in the case of a configuration shown in FIG. 3, the first conductor part A is a conductor which is present in the outer peripheral part of the U phase upper drive circuit 41, and the second conductor part B is a conductor which is present in the inner peripheral part of the control circuit 48.

Further, in the following description, a potential of the first conductor part A is referred to as first potential Va and a potential of the second conductor part B is referred to as a second potential Vb. Thus, in the case of the configuration shown in FIG. 3, the first potential Va is the U phase potential Vu and the second potential Vb is the ground potential Vg. Moreover, a direction from the first conductor part A to the second conductor part B is referred to as second direction db and a direction from the second conductor part B to the first conductor part A is referred to as first direction Da. Hence, in the case of the configuration shown in FIG. 3, the second direction db is the left direction and the first direction Da is the right direction.

The first conductor part A and the second conductor part B each has a plurality of layers in the up-down Z which are connected to each other. Note that these layers may be connected by through holes or may be connected by a buildup.

Hereinafter, the uppermost layer in the first conductor part A is referred to as first surface layer part A1 and the second layer and subsequent layers from the above in the first conductor part A are referred to as a first inner layer part A2 to A4. The uppermost layer in the second conductor part B is referred to as second surface layer part B1 and the second layer and subsequent layers from the above in the second conductor part B are referred to as a second inner layer part B2 to B4. The first surface layer A1 and the second surface layer B1 are provided on the upper surface of the substrate 49, and the first inner layer part A2 to A4 and the second inner layer part B2 to B4 are provided inside the substrate 49. In FIG. 3, as the first inner layer part A2 to A4, only the second layer (A2), the third layer (A3) and the fourth layer (A4) from the above are shown. However, the first inner layer part A2 to A4 may be composed of any number of layers. Similarly, the second inner layer part B2 to B4 may be composed of any number of layers.

Each of the first inner layer part A2 to A4 has a conductive protrusion ρ that protrudes in the second direction db from the first surface layer part A1. Hereinafter, a length of the conductive protrusion ρ protruding in the second direction db from a portion of the first surface layer A1 is defined as a protrusion length ρL. According to the present embodiment, the protrusion length ρL of the conduction protrusion ρ in the respective first inner layer part A2 to A4 are the same. The protrusion length ρL is longer than or equal to 50 μm and 10% or less of the creeping distance G. In other words, since the creeping distance G is approximately 4 mm as described above, the protrusion length ρL is approximately from 50 μm to 400 μm.

Hereinafter, a configuration in which the first inner layer part A2 to A4 includes a conduction protrusion is referred to as a first protruded configuration.

In FIG. 3, as described above, the first conductive part A is an outer peripheral part of the U phase upper drive circuit 41 and the second conductive part B is an inner peripheral part of the control circuit 48. However, also in the facing section, similarly, the first conductive part A and the second conductive part B may be appropriately substituted for corresponding one. That is, any two combinations selected from among total 5 portions (Vu, Vv, Vw, Vn, Vg) of the outer peripheral parts (Vu) of the U phase upper drive circuit 41, the outer peripheral part (Vv) of the V phase upper drive circuit 42, the outer peripheral part (Vw) of the W phase upper drive circuit 43, the outer peripheral part (Vn) of 3 lower drive circuits 44 to 46 and the inner peripheral part (Vg) of the control circuits 48 are similar to those shown in FIG. 3. Note that the outer peripheral part (Vu) of the U phase upper drive circuit 41, the outer peripheral part (Vw) of the W phase upper drive circuit 43 are excluded since they do not face each other. In the any two combinations, either one combination is the first conductive part A and the other one combination is the second conductive part B. In other words, for example, a combination in which the V phase drive circuit 42 is the first conductive part A and the W phase drive circuit 43 is the second conductive part B, or a combination in which the V phase upper drive circuit 42 is the first conductive part A and the V phase lower drive circuit 45 is the second conductive part B are similar to those shown in FIG. 3.

Then, as shown in FIG. 2, in any combinations, the first protruded configuration is provided in all of the facing sections. That is, for example, when the outer peripheral part of the U phase upper drive circuit 41 is the first conductive part A and the inner peripheral part of the control circuit 48 is the second conductive part B, the first protruded configuration is provided in all of the facing sections of the outer peripheral part of the U phase upper drive circuit 41 and the inner peripheral part of the control circuit 48. Specifically, the conductive protrusion ρ is provided in all of the facing sections of a left edge and a rear edge of the U phase upper drive circuit 41 and the inner peripheral part of the control circuit 48.

Hereinafter, the function of the conductive protrusion ρ in the first protruded configuration as described above will be described.

Figure 4:
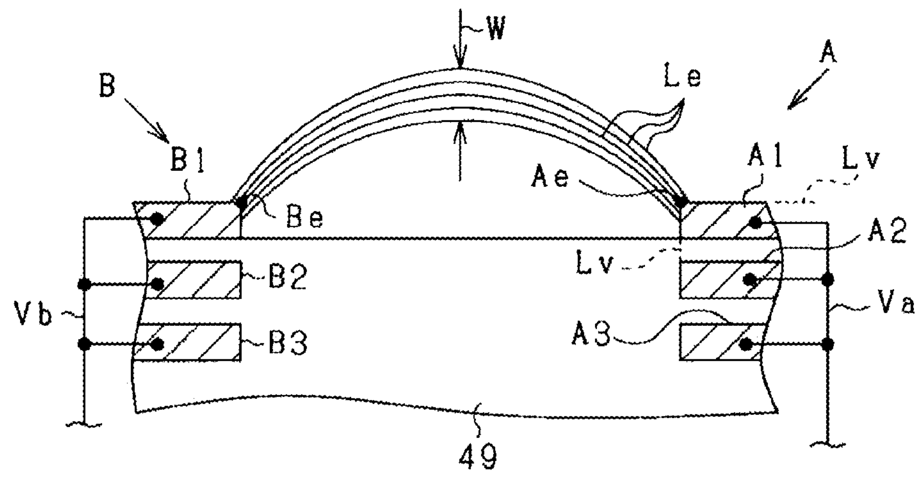
FIG. 4 is a front cross-sectional diagram showing a cross-section of electronic equipment and its electric lines of force according to a comparative example.

FIG. 4 is a front cross-sectional diagram showing a comparative example in which the conductive protrusion ρ is removed from the configuration of the present embodiment. Hereinafter, a first edge Ae is defined as an edge in a second direction db side on an upper surface of a first surface layer part A1, and a second edge Be is defined as an edge in a first direction Da side on an upper surface of a second surface layer part B1.

In the first surface layer part A1, electric field is concentrated at the first edge Ae, whereby electric lines of force Le are emitted from the first edge Ae towards a direction obliquely to the upper side with respect to the second direction db, extending parabolically to reach the second edge Be.

This is because the electric lines of force Le are emitted perpendicularly to equipotential lines Lv. In this respect, for example, on the upper surface of the first surface layer part A1, the equipotential line Lv extends along the upper surface of the first surface layer part A1, and the equipotential line Lv extends in the up-down Z on an end face of the first surface layer A1 in the second direction db side. Hence, at the first edge Ae, the electric lines of force Le are emitted towards a direction orthogonal to an intermediate direction thereof. That is, at the first edge Ae, the electric lines of force Le are emitted upwardly towards an oblique direction with respect to the second direction db. Thus, as described above, electric lines of force Le extend parabolically from the first edge Ae to reach the second edge Be. Since electric lines of force Le are densely formed at the edges Ae and Be due to concentration of the electric field, a discharge is started between these edges Ae and Be.

Figure 5:
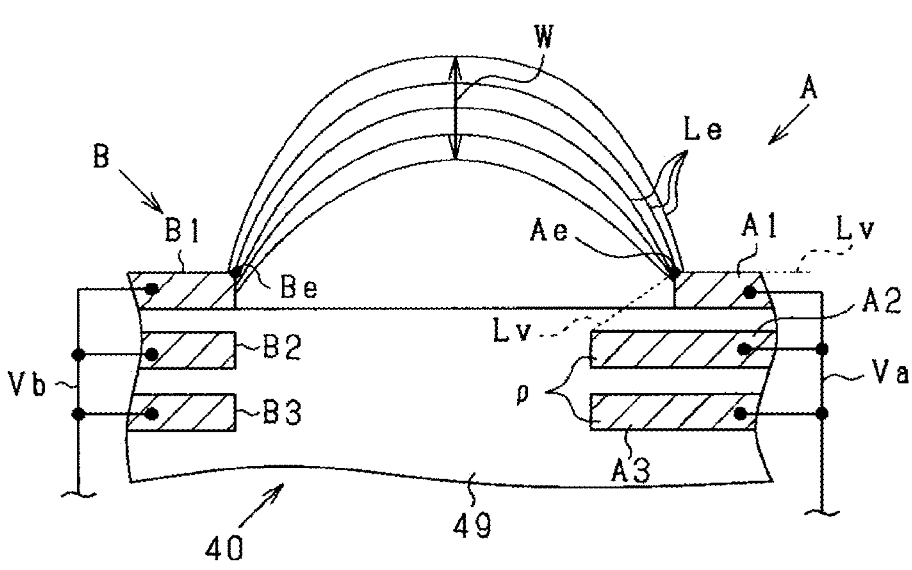
FIG. 5 is a front cross-sectional diagram showing electronic equipment and its electric lines of force according to the present embodiment.

In this respect, according to the present embodiment, as shown in FIG. 5, the first inner layer part A2 to A4 includes the conductive protrusion ρ. Hence, in the second direction db side of the first surface layer A1, the equipotential line Lv does not extend in the up-down Z but extends obliquely with respect to the up-down Z direction towards the second direction db side. Hence, compared to the comparative example, an angle orthogonal to the equipotential line Lv at the first edge Ae, that is an emission angle of the electric lines of force Le, is increased.

Hence, the electric lines of force Le are likely to be distributed in the up-down Z direction comparing with the comparative example. In other words, a vertical width W of the electric lines of force Le having a predetermined quantity is larger than the vertical width W of the comparative example. Thus, the density of the electric lines of force Le is lowered and the discharge is unlikely to occur. Hence, the discharge start voltage becomes higher.

Figure 6:
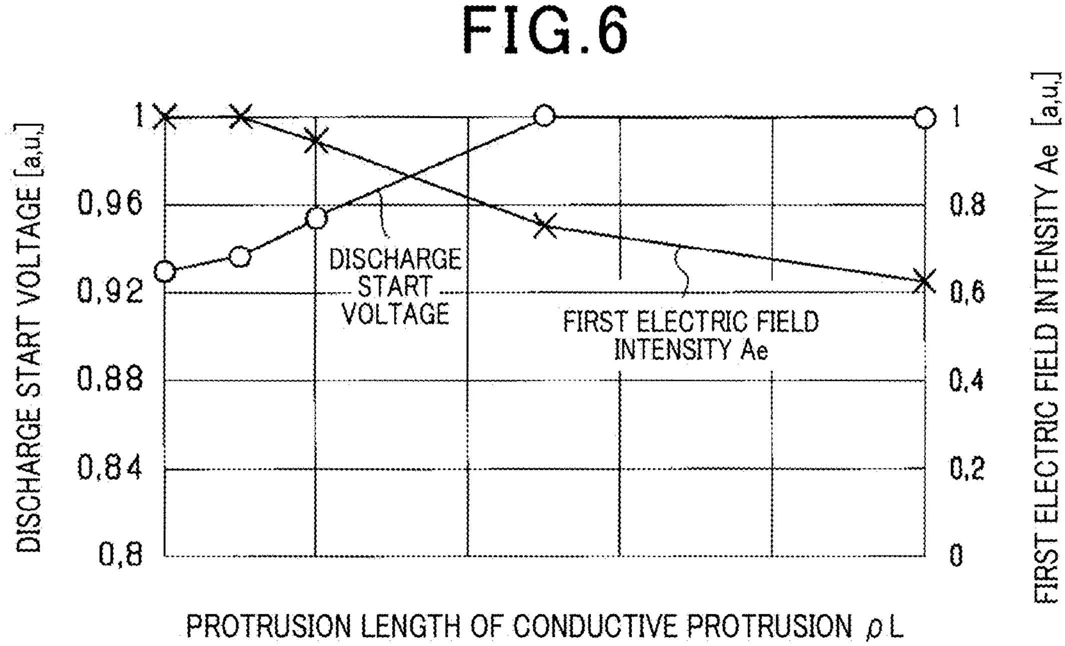
FIG. 6 is a graph showing a relationship between a protrusion length of a conductive protrusion and a discharge start voltage.

FIG. 6 is a graph showing a result of a simulation performed by persons involved in the present disclosure. FIG. 6 shows a protrusion length ρL of the conductive protrusion ρ in the horizontal axis, and a discharge start voltage and an electric field intensity of the first edge Ae in the vertical axis. In FIG. 6, it is confirmed that the electric field intensity at the first edge Ae becomes smaller as the protrusion length ρL is set to be longer, and the discharge start voltage becomes larger accompanied with this. Hence, the discharge is unlikely to occur.

More specifically, it is confirmed that the discharge start voltage becomes higher as the protrusion length ρL is set to be longer until the protrusion length ρL becomes appropriately 50 μm, and thereafter the discharge start voltage is substantially constant. For this reason, according to the present embodiment, as described above, the protrusion length ρL is set to be longer than or equal to 50 μm, whereby effects of utilizing the conductive protrusion part ρ can be obtained as much as possible when setting the protrusion length ρL to be longer than or equal to 50 μm.

Effects and advantages of the present disclosure will be summarized as follows.

Each of the first inner layer part A2 to A4 has the conductive protrusion ρ that protrudes in the second direction db from the first surface layer part A1. With the conductive protrusion ρ, the direction of the electric lines of force Le from the first surface layer part A1 to the second surface layer part B1 is changed and the electric lines of force Le can be distributed in the up-down Z direction. Thus, occurrence of discharge can be suppressed with the conductive protrusion ρ regardless of the creeping distance G, that is, the discharge start voltage can be higher. Accordingly, for example, the discharge start voltage can be higher while maintaining the creeping distance, or the creeping distance can be set to be shorter while maintaining the discharge start voltage.

Further, according to the first protruded configuration, since only with the circuit configuration without using the resin sealing or the like, the discharge can be suppressed, also a material cost and manufacturing cost can be prevented from being increased. Further, since it is not required to seal the conductor with a resin sealing and the like, there is no concern that resin-peeling or a deterioration of insulation properties possibly occur due to an aging degradation.

According to the present embodiment, as described above, in any combinations, the first protruded configuration is provided in all of the facing sections. Hence, compared to a case where the first protruded configuration is provided only in a part of facing sections, occurrence of discharge can be strongly suppressed.

Further, according to the present embodiment, the first inner layer part A2 most adjacently positioned to the first surface layer A1, as a second layer from the top layer of the first surface layer A1, has the conductive protrusion ρ. Since the second layer (A2) from the top layer exerts the most significant influence on the electric lines of force Le of the first surface layer A1, discharge can be effectively prevented from occurring.

According to the present embodiment, the protrusion length ρL of the conductive protrusion ρ is set to be longer than or equal to 50 μm. This is because, according to the above-described simulation analysis, the discharge start voltage becomes higher as the protrusion length ρL is set to be longer until the protrusion length ρL reaches appropriately 50 μm. Hence, effects of utilizing the conductive protrusion part ρ can be obtained as much as possible.

Further, according to the present embodiment, the protrusion length ρL of the conductive protrusion ρ is set to be 10% of the creeping distance G or less. Hence, there is no concern that a discharge is likely to occur between the first inner layer part A2 to A4 and the second surface layer part B1.

OTHER EMBODIMENTS

The above-described embodiments may be modified in the following manners, for example.

According to the first embodiment, the conductive protrusion ρ is provided in the first inner layer part A2 to A4. In addition to this configuration, as shown in the modification example 1 shown in FIG. 7, a conductive protrusion ρ that protrudes in the first direction Da from the second surface layer part B1 may be provided. Hereinafter, a configuration in which the second inner layer part B2 to B4 includes the conductive protrusion ρ is referred to as second protruded configuration.

Figure 7:
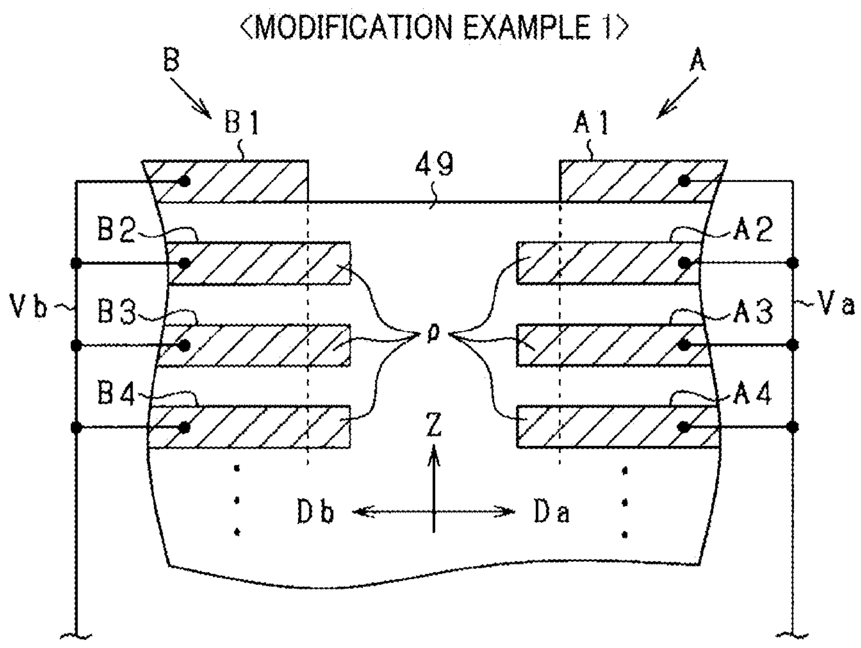
FIG. 7 is a front cross-sectional diagram showing electronic equipment according to a first modification example.
Figure 8:
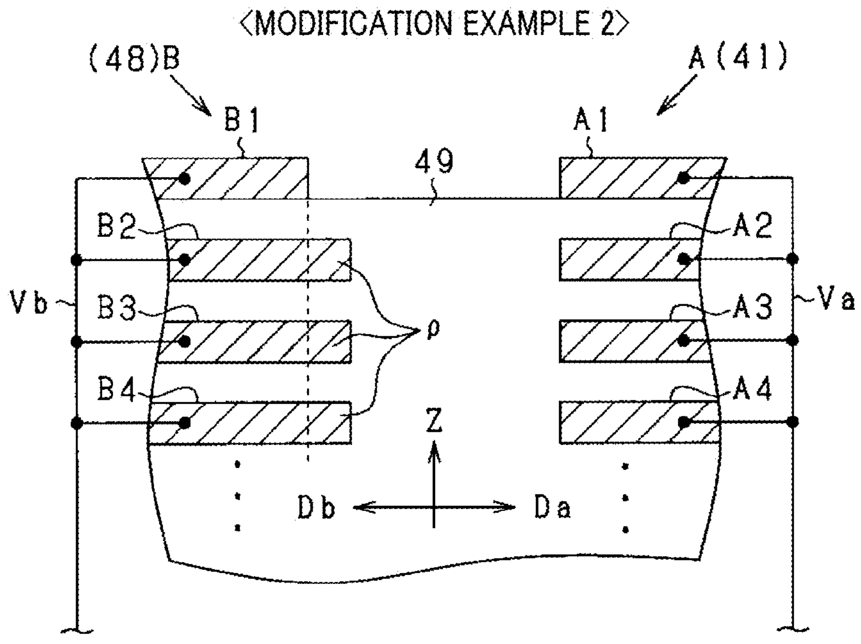
FIG. 8 is a front cross-sectional diagram showing electronic equipment according to a second modification example.

In other words, as shown in the modification example 1 shown in FIG. 7, both of the first protruded configuration and the second protruded configuration may be provided in a predetermined facing section. Also, as shown in a modification example 2 shown in FIG. 8, only the second protruded configuration may be provided in a predetermined facing section without providing the first protruded configuration.

In the above-described cases, in any combinations, at least one protruded configuration between the first protruded configuration and the second protruded configuration may preferably be provided in all of facing sections, since discharge can be strongly suppressed.

Figure 9:
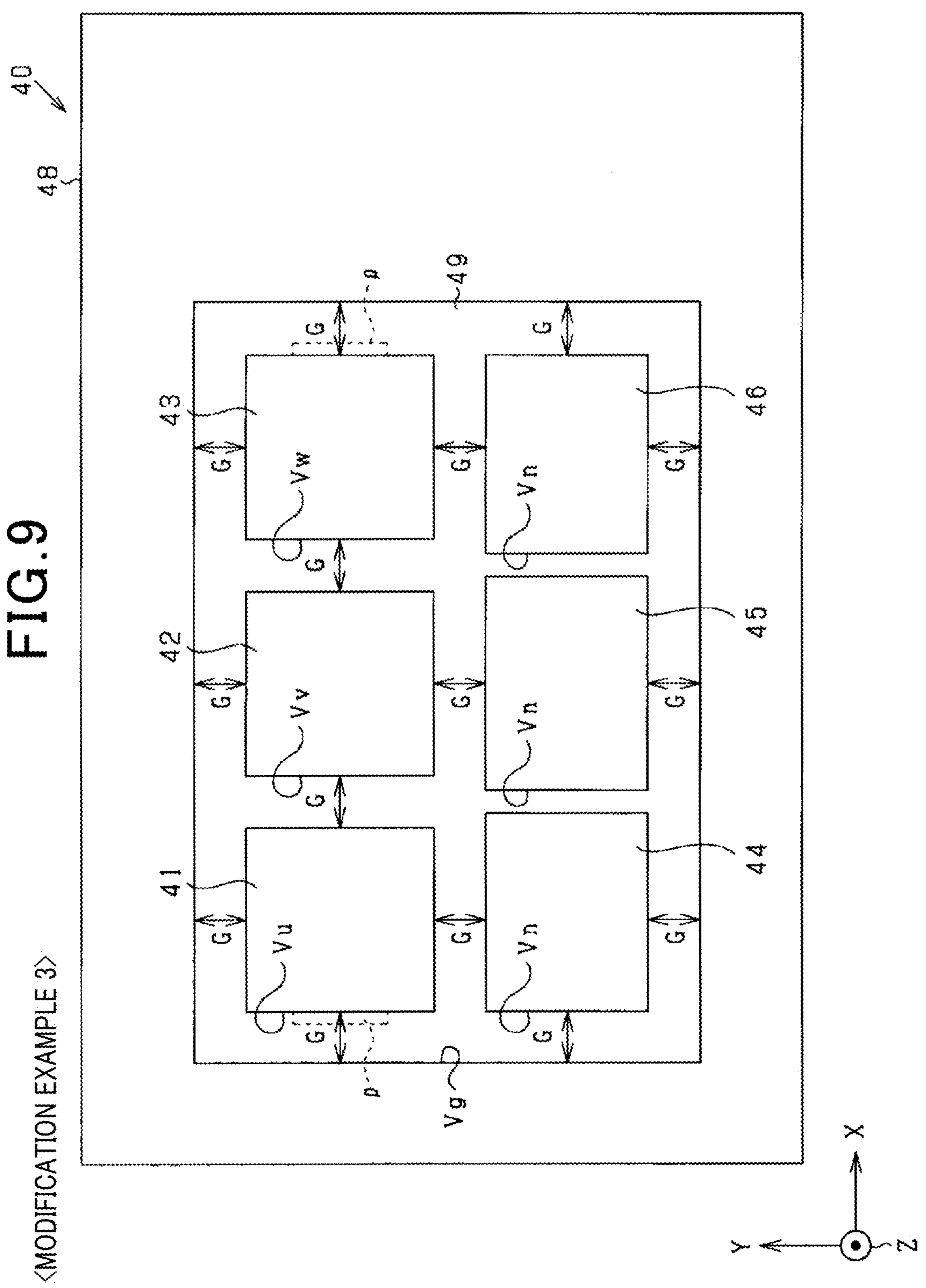
FIG. 9 is a plan view showing electronic equipment according to a third modification example.

However, instead of the above configuration, at least one protruded configuration between the first protruded configuration and the second protruded configuration may be provided in a part of the facing sections. Specifically, as shown in a modification example 3 shown in FIG. 9, in the case where an exact location where a discharge is likely to occur is known, the conductive protrusion ρ may be provided only at the exact location where a discharge is likely to occur.

Figure 10:
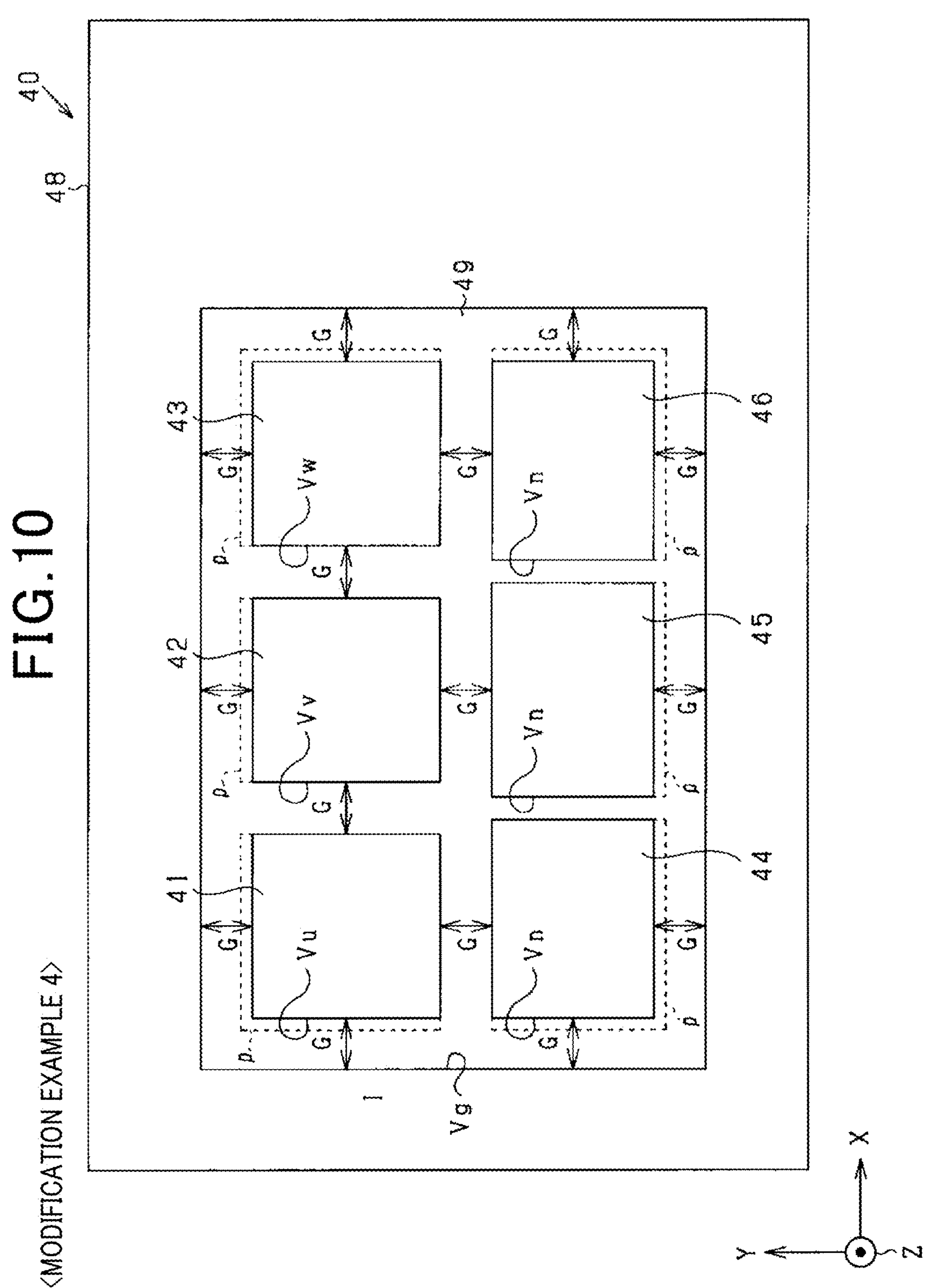
FIG. 10 is a plan view showing electronic equipment according to a fourth modification example.
Figure 11:
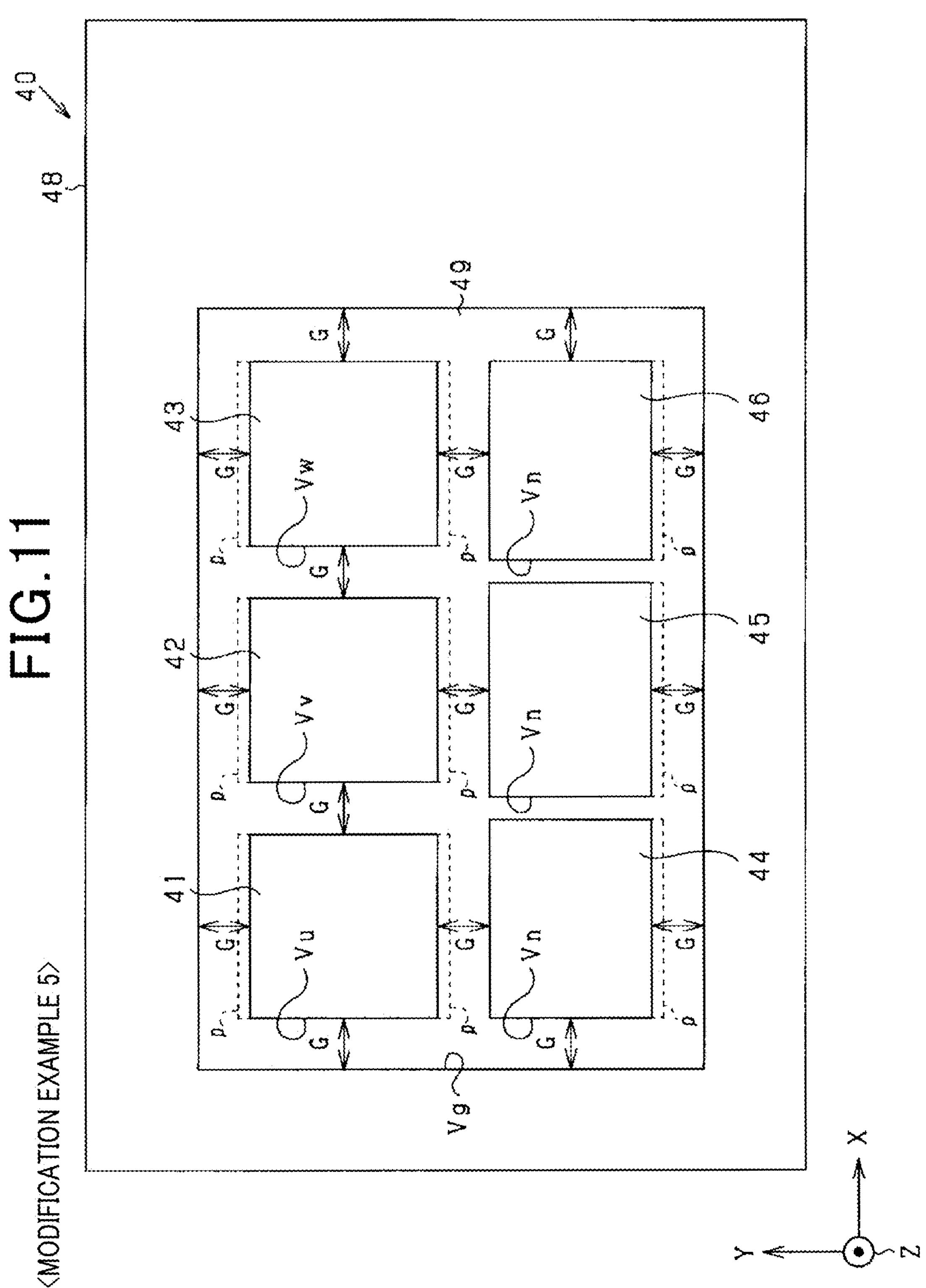
FIG. 11 is a plan view showing electronic equipment according to a fifth modification example.
Figure 12:
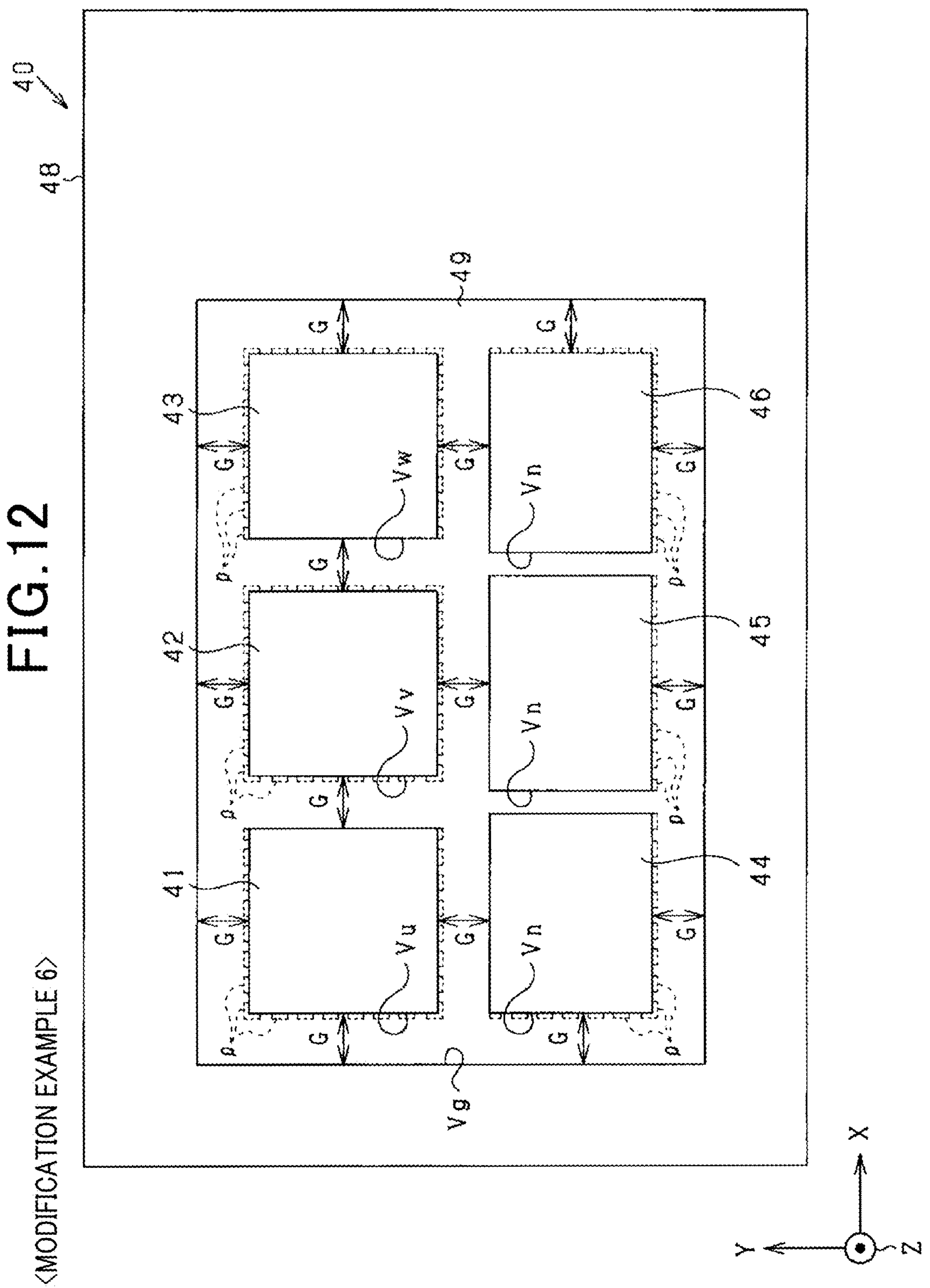
FIG. 12 is a plan view showing electronic equipment according to a sixth modification example.

For example, as shown in a modification example 4 shown in FIG. 10, in the case where a discharge is more likely to occur at facing sections between an inner peripheral part of the control circuit 48 and an outer edge part of the respective six drive circuits 41 to 46, the conductive protrusion ρ may be provided only at the above facing sections. Also, as shown in a modification example 5 shown in FIG. 11, in the case where a discharge is more likely to occur at facing section facing in the front-rear Y, the conductive protrusion ρ may be provided only at these facing sections. Moreover, for example, as shown in a modification example 6 shown in FIG. 12, when an area for providing the conductive protrusion ρ is required to be reduced, the conductive protrusion ρ may be intermittently provided along a direction orthogonal to the longitudinal direction of the creeping distance G.

However, in any combinations of these cases, at least one of the first protruded configuration and the second protruded configuration may preferably be provided at more than or equal to a half of sections in all of the facing sections. This is because a discharge can readily be suppressed when more than half sections has either one protruded configuration.

Figure 13:
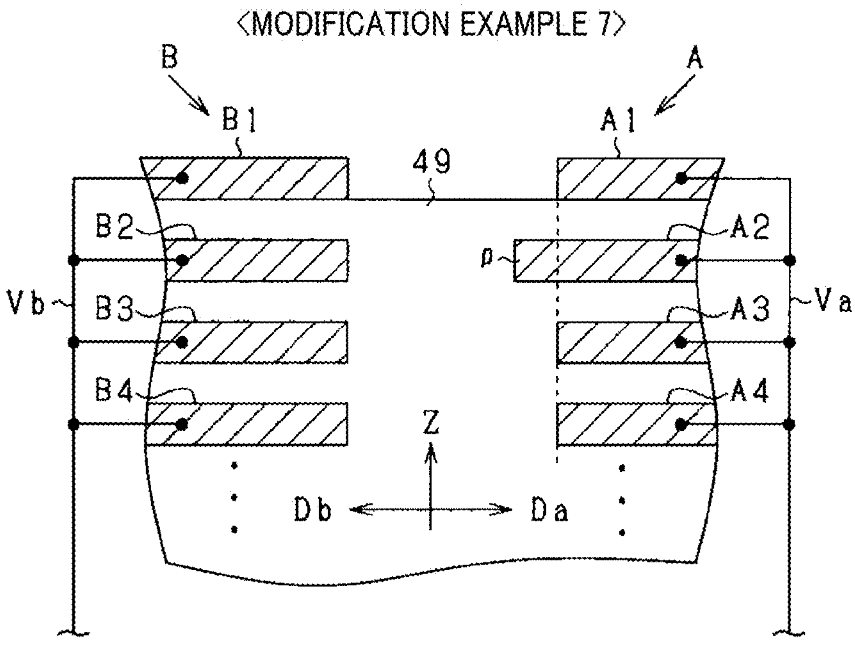
FIG. 13 is a front cross-sectional diagram showing electronic equipment according to a seventh modification example.

According to the first embodiment, the conductive protrusion ρ is provided at respective first inner layer part A2 to A4 positioned at the second and subsequent layer positions. Alternatively, as shown in the comparative example 7 shown in FIG. 13, the conductive protrusion ρ may be provided only at the first inner layer part A2 positioned at the second layer position from the top layer, which is the most adjacent to the first surface layer part A1. As described above, since the second layer from the top influences the electric lines of force LE between the first surface layer part A1 and the second surface layer B1, according to the comparative example 7, with the total area of the conductive protrusion ρ which is much smaller than that of other examples, the discharge can be more effectively suppressed.

Also, similar to this, in the second protrusion configuration, the conductive protrusion ρ may be provided only at the second inner layer part B2 positioned at the second layer from the top layer, which is the most adjacent to the second surface layer part B1.

Figure 14:
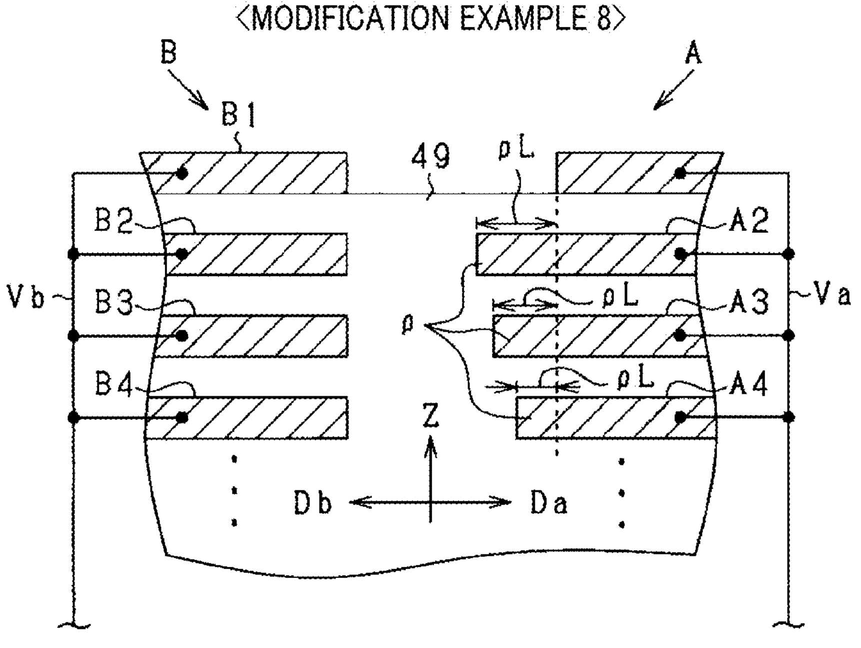
FIG. 14 is a front cross-sectional diagram showing electronic equipment according to an eighth modification example.

According to the first embodiment, the protrusion length ρL of the conductive protrusions ρ in the respective layer of the first inner layer part A2 to A4 are mutually the same. Instead of this configuration, as shown in comparative example shown in FIG. 14, the protrusion length ρL may be mutually different. In other words, for example, the first protruded configuration may be configured such that the first inner layer part A2 which is the second layer from the top layer has a conductive protrusion ρ having a predetermined protrusion length ρL and the first inner layer A3 which is the third layer from the top layer has a conductive protrusion ρ having a protrusion length ρL which is different from that of the second layer. Similarly, in the second protruded configuration, the protrusion length ρL of the conductive protrusions ρ in the respective layers of the second inner layers B2 to B4 may be mutually different.

According to the first embodiment, the conductive protrusion ρ is provided protruding from the first inner layer part A2 to A4 towards the second direction db. Instead of this configuration, as shown in the comparative example 9 shown in FIG. 15, a floating conductive part φ may be provided as a conductor isolated from the first inner layer part A2 to A4 and the second inner layer part B2 to B4. The floating conductive part φ is positioned away from the first inner layer part A2 to A4 towards the second direction db inside the substrate 49. Hereinafter, as described above, a configuration in which the floating conductive part φ is provided being positioned away from the first inner layer part A2 to A4 towards the second direction db inside the substrate 49 is referred to as a first floating configuration. That is, as shown in the modification example 9 shown in FIG. 15, the switch driving unit 40 may include the first floating configuration.

Figure 15:
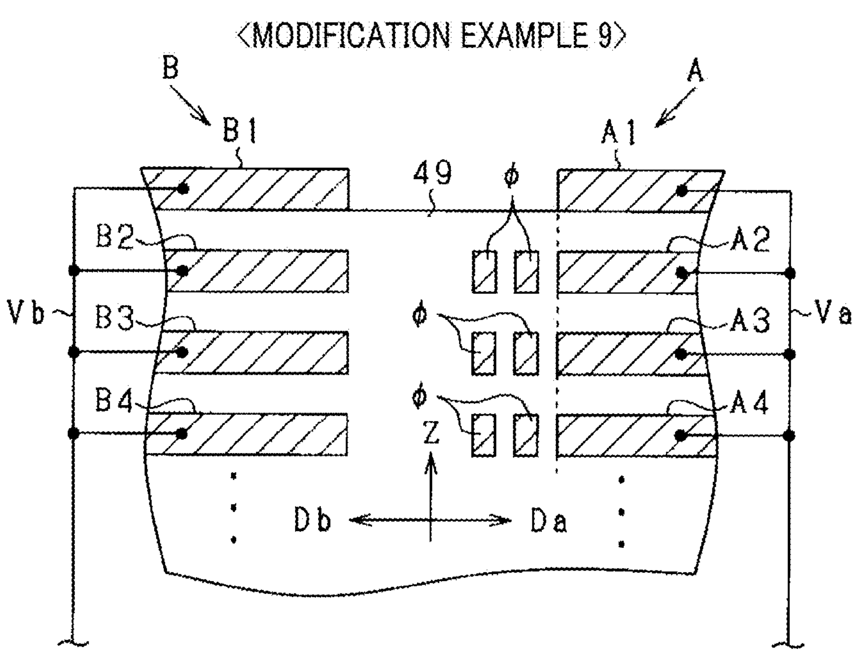
FIG. 15 is a front cross-sectional diagram showing electronic equipment according to a ninth modification example.

Further, a floating conductive part φ isolated from the first inner layer A2 to A4 and the second inner layer part B2 to B4 may be added to the configuration of the modification example 9 shown in FIG. 15, in which the floating conductive part φ is in the substrate 49 from the second inner layer part B2 to B4 towards the first direction Da. Hereinafter, as described above, a configuration in which the floating conductive part φ is provided being positioned away from the second inner layer part B2 to B4 towards the first direction Da inside the substrate 49 is referred to as a second floating configuration. That is, the switch driving unit 40 may include the second floating configuration in addition to the first floating configuration.

Further, the switch driving unit 40 may only include the second floating configuration without the first floating configuration. Note that persons involved in the present disclosure have confirmed that the discharge start voltage can be increased by such a floating conductive part φ, with a simulation analysis.

Hereinafter, the first embodiment and modification examples 1 to 8 and modifications thereof are referred to as first embodiment and the like, and the modification example 9 and the modifications thereof are referred to as modification example 9 and the like. The first embodiment and the like and the modification example 9 and the like can be further modified in the following manners.

According to the first embodiment and the like, the first protruded configuration and the second protruded configuration are provided. Alternatively, or in addition to these configurations, the first protruded configuration or the second protruded configuration may be provided for a discharge at the lower surface. In the modification example 9 or the like, the first floating configuration or the second floating configuration are provided for a discharge at the upper surface. Alternatively, or in addition to these configurations, the first floating configuration or the second floating configuration may be provided for a discharge at the lower surface.

In the modification example 9 or the like, the first floating configuration instead of the first protruded configuration is provided, or the second floating configuration is provided instead of the second floating configuration. Alternatively, the first floating confirmation may be provided in addition to the first protruded configuration or the second floating configuration may be provided in addition to the second protruded configuration.

In the first embodiment or the like or the modification example 9, the first surface layer part A1 and the second surface layer part B1 are provided on the upper surface of the substrate 49, but may be provided inside the substrate 49 or inside other insulators. Specifically, it is exemplified that the first surface layer part A1 and the second surface layer part B1 are provided on the surface of the substrate 49 and the first surface layer part A1 and the second surface layer B1 are coated by a insulation material (solder resist) different from the material of the substrate 49. Even in these cases, since most of the electric lines of force Le extending parabolically pass outside the substrate 49 (gas such as air and the like), discharge is likely to occur compared to a portion between the first inner layer part A2 to A4 and the second inner layer part B2 to B4. Hence, even in these cases, significant advantages are present in which the protruded configuration and the floating configuration suppress discharging.

According to the first embodiment and the modification example 9 and the like, an object electronic apparatus is the switch driving unit 40. Alternatively, the object electronic apparatus may be any electronic apparatus having a second conductor part B of which the potential is different from that of the first conductor part B.

The present disclosure has been described in accordance with the embodiments. However, the present disclosure is not limited to the embodiments and structure thereof. The present disclosure includes various modification examples and modifications within the equivalent configurations. Further, various combinations and modes and other combinations and modes including one element or more or less elements of those various combinations are within the range and technical scope of the present disclosure.

CONCLUSION

According to the present disclosure, discharging is suppressed regardless of the creeping distance while suppressing an increase in the material cost and the manufacturing cost and mitigating deterioration of the insulation properties due to an aging degradation.

An electronic apparatus according to the present disclosure is provided with a substrate made of an insulator and a circuit mounted on the substrate. The circuit includes a first conductive part having a plurality of layers in a predetermined lamination direction and a second conductive part having a plurality of layers in a portion positioned away from the first conductive part in a direction orthogonal to the lamination direction, a potential of the second conductive part being different from that of the first conductive part.

The first conductive part includes a first surface layer part that constitutes an end layer in the laminate direction and a first inner layer part that constitutes a layer different from the first surface layer part in the substrate. The second conductive part includes a second surface layer part that constitutes an end layer in the laminate direction, facing the first surface layer with a creeping distance therebetween, and a second inner layer part that constitutes a layer different from the second surface layer part in the substrate.

In the electronic apparatus, at least one of a first protruded configuration and a second protruded configuration is provided. The first protruded configuration is configured such that the first inner layer part includes a first conductive protrusion protruding towards the second conductive part from the first surface layer part in a plan view when viewed in the lamination direction. The second protruded configuration is configured such that the second inner layer part includes a second conductive protrusion protruding towards the first conductive part from the second surface layer part in a plan view when viewed in the lamination direction.

According to the present disclosure, at least either one of the first inner layer part and the second inner layer part includes a conductive protrusion that protrudes towards the other side of the layer part. The persons involved in the present disclosure have found that electric lines of force between the first surface layer part and the second surface layer part are distributed with the conductive protrusion, whereby occurrence of discharge can be suppressed, that is, the discharge start voltage can be higher. Therefore, according to the present disclosure, the conductive protrusion is able to suppress the discharge regardless of the creeping distance.

Further, according to the above configurations, without using the resin sealing, since the discharge can be suppressed only with the circuit-configuration, a material cost and a manufacturing cost can be prevented from increasing. Moreover, since the conductor is not required to be sealed with a resin sealing and the like, there is no need for concern about a degradation of insulation properties caused by a resin-peeling due to an aging degradation.

As described, according to the present embodiment, discharge can be suppressed regardless of the creeping distance while preventing the material and manufacturing cost from increasing and suppressing a degradation of the insulation properties due to the aging degradation.

What is claimed is:

1. An electronic apparatus comprising:

a substrate made of an insulator; and a circuit mounted on the substrate, the circuit including a first conductive part having a plurality of layers in a predetermined lamination direction and a second conductive part having a plurality of layers in a portion positioned away from the first conductive part in a direction orthogonal to the lamination direction, a potential of the second conductive part being different from that of the first conductive part, wherein the first conductive part includes a first surface layer part that constitutes an end layer in the laminate direction and a first inner layer part that constitutes a layer different from the first surface layer part in the substrate;

the second conductive part includes a second surface layer part that constitutes an end layer in the laminate direction, facing the first surface layer with a creeping distance therebetween, and a second inner layer part that constitutes a layer different from the second surface layer part in the substrate; and at least one of a first protruded configuration and a second protruded configuration is provided, the first protruded configuration being configured such that the first inner layer part includes a first conductive protrusion protruding towards the second conductive part from the first surface layer part in a plan view when viewed in the lamination direction, and the second protruded configuration being configured such that the second inner layer part includes a second conductive protrusion protruding towards the first conductive part from the second surface layer part in a plan view when viewed in the lamination direction, wherein the circuit includes a drive circuit that drives a switch of an inverter and a control circuit that controls the drive circuit; and the first conductive part serves as a part of the drive circuit and the second conductive part serves as a part of the control circuit.

2. The electronic apparatus according to claim 1, wherein at least one of the first protruded configuration and the second protruded configuration is provided at more than or equal to half of sections in all of facing sections where the first surface layer part and the second surface layer part face each other with the creeping distance therebetween.

3. The electronic apparatus according to claim 2, wherein at least one of the first protruded configuration and the second protruded configuration is provided at all of the facing sections.

4. The electronic apparatus according to claim 1, wherein the first protruded configuration is configured such that the first inner layer part most adjacently positioned to the first surface layer part includes the first conductive protrusion; and the second protruded configuration is configured such that the second inner layer part most adjacently positioned to the second surface layer part includes the second conductive protrusion.

5. The electronic apparatus according to claim 1, wherein the first protruded configuration is configured such that the first conductive protrusion protrudes towards the second conductive part from the first surface layer part by 50 μm or more in the plan view; and the second protruded configuration is configured such that the second conductive protrusion protrudes towards the first conductive part from the second surface layer part by 50 μm or more in the plan view.

6. The electronic apparatus according to claim 1, wherein the first protruded configuration is configured such that the first conductive protrusion protrudes towards the second conductive part from the first surface layer part within a range of 10% or less of the creeping distance in the plan view; and the second protruded configuration is configured such that the second conductive protrusion protrudes towards the first conductive part from the second surface layer part within a range of 10% or less of the creeping distance in the plan view.

7. The electronic apparatus according to claim 1, wherein the first protruded configuration is configured such that a predetermined layer in the first inner layer part protrudes towards the second conducive part from the first surface layer part by a predetermined first protrusion length to form the first conductive protrusion, and a layer different from the predetermined layer in the first inner layer protrudes towards the second conducive part from the first surface layer part by a length different from the first protrusion length to form the first conductive protrusion; and the second protruded configuration is configured such that a predetermined layer in the second inner layer part protrudes towards the first conducive part from the second surface layer part by a predetermined second protrusion length to form the second conductive protrusion, and a layer different from the predetermined layer in the second inner layer protrudes towards the first conducive part from the second surface layer part by a length different from the second protrusion length to form the second conductive protrusion.

8. The electronic apparatus according to claim 1, wherein at least one of a first floating configuration and a second floating configuration is provided, the first floating configuration being configured such that a floating conductive part made of a conductor is provided being positioned away from the first inner layer part towards the second conductive part in the substrate and insulated from the first inner layer part and the second inner layer part; the second floating configuration being configured such that a floating conductive part made of a conductor is provided being positioned away from the second inner layer part towards the first conductive part in the substrate and insulated from the first inner layer part and the second inner layer part.

9. An electronic apparatus comprising:

a substrate made of an insulator; and a circuit mounted on the substrate, the circuit including a first conductive part having a plurality of layers in a predetermined lamination direction and a second conductive part having a plurality of layers in a portion positioned away from the first conductive part in a direction orthogonal to the lamination direction, a potential of the second conductive part being different from that of the first conductive part, wherein the first conductive part includes a first surface layer part that constitutes an end layer in the laminate direction and a first inner layer part that constitutes a layer different from the first surface layer part in the substrate;

the second conductive part includes a second surface layer part that constitutes an end layer in the laminate direction, facing the first surface layer with a creeping distance therebetween, and a second inner layer part that constitutes a layer different from the second surface layer part in the substrate; and at least one of a first protruded configuration and a second protruded configuration is provided, the first protruded configuration being configured such that the first inner layer part includes a first conductive protrusion protruding towards the second conductive part from the first surface layer part in a plan view when viewed in the lamination direction, and the second protruded configuration being configured such that the second inner layer part includes a second conductive protrusion protruding towards the first conductive part from the second surface layer part in a plan view when viewed in the lamination direction, wherein the circuit includes a plurality of drive circuits that drive a plurality of switches of the inverter; and the first conductive part serves as a part of predetermined drive circuits and the second conductive part serves as a part of the drive circuit other than the predetermined drive circuits.

* * * * *